United States Patent
Tseng

[11] Patent Number: 5,811,762
[45] Date of Patent: Sep. 22, 1998

[54] HEATER ASSEMBLY WITH DUAL TEMPERATURE CONTROL FOR USE IN PVD/CVD SYSTEM

[75] Inventor: Jeng-Ding Tseng, Hsin-Chu, Taiwan

[73] Assignee: Taiwan Semiconductor Manufacturing Company, Ltd., Hsin-Chu, Taiwan

[21] Appl. No.: 719,348

[22] Filed: Sep. 25, 1996

[51] Int. Cl.[6] .......................... H01L 21/324; H01L 21/68; C23C 16/00; F28F 7/02
[52] U.S. Cl. .......................... 219/385; 219/390; 392/418; 118/728; 165/61; 165/104.19; 438/799
[58] Field of Search .................................... 219/390, 405, 219/411, 385; 392/416, 418; 118/724, 725, 728, 50.1; 165/58, 61, 104.11–104.34; 427/557, 585, 587, 588; 438/799; 432/152

[56] References Cited

U.S. PATENT DOCUMENTS

| | | | |
|---|---|---|---|
| 4,512,391 | 4/1985 | Harra | 118/725 |
| 5,113,929 | 5/1992 | Nakagawa et al. | 165/61 |
| 5,434,110 | 7/1995 | Foster et al. | 437/245 |
| 5,467,220 | 11/1995 | Xu | 359/350 |
| 5,511,608 | 4/1996 | Boyd | 118/724 |
| 5,562,947 | 10/1996 | White et al. | 118/725 |
| 5,588,827 | 12/1996 | Muka | 432/5 |
| 5,595,241 | 1/1997 | Jelinek | 118/725 |

*Primary Examiner*—John A. Jeffery
*Assistant Examiner*—J. Pelham
*Attorney, Agent, or Firm*—George O. Saile; Stephen B. Ackerman

[57] ABSTRACT

A heat pedestal is described for use in a physical vapor deposition/chemical vapor deposition system in which cooling gas, cooling water and heated gas are used to bring a semiconductor wafer to the desired low or high temperature. Use of the apparatus and method described leads to a very rapid transition from one temperature to another. Also achieved is a precise temperature control over a wide range yielding increased flexibility of process control.

23 Claims, 1 Drawing Sheet

HEATER ASSEMBLY WITH DUAL TEMPERATURE CONTROL FOR USE IN PVD/CVD SYSTEM

BACKGROUND OF THE INVENTION

1. Field of the Invention

The invention relates to the field of physical vapor deposition or chemical vapor deposition, more particularly to ways to rapidly change the temperature of a semiconductor wafer that is placed on a heat pedestal.

2. Description of the Prior Art

In integrated circuit technology semiconductor wafers are required to reach certain temperatures as they go through different processing steps. Reaching the desired temperature quickly imparts an economic advantage.

Prior art has not dealt with the means or methods of achieving these temperatures rapidly. For example, U.S. Pat. 5,434,110 (Foster et al.) discusses the various temperatures required for certain processes, but does not address how these temperatures are to be achieved. U.S. Pat. 5,467,220 shows gas being heated by a heater in the pedestal and deals with uniformity of the temperature across the semiconductor wafer, but no mention is made of the time it takes to reach a certain high or low temperature.

SUMMARY OF THE INVENTION

It is an object of the present invention to provide a method and an apparatus for a heat pedestal, used in physical or chemical vapor deposition, so that a semiconductor wafer can be taken very rapidly from one temperature to another, thus increasing productivity.

A further object of the present invention is to provide precise temperature control over a wide range, thereby, yielding increased flexibility of the process control.

These objects have been achieved by cooling or heating the semiconductor wafer with cool or hot gas respectively and by ducting water through the pedestal. Hot gas is produced by heating ambient temperature gas with an electrical heating element in a heater cavity in the center of the pedestal. Another novel refinement is the use of a vacuum jacket to thermally isolate the pedestal from the heater cavity.

DESCRIPTION OF THE PREFERRED EMBODIMENT

Figure 1:
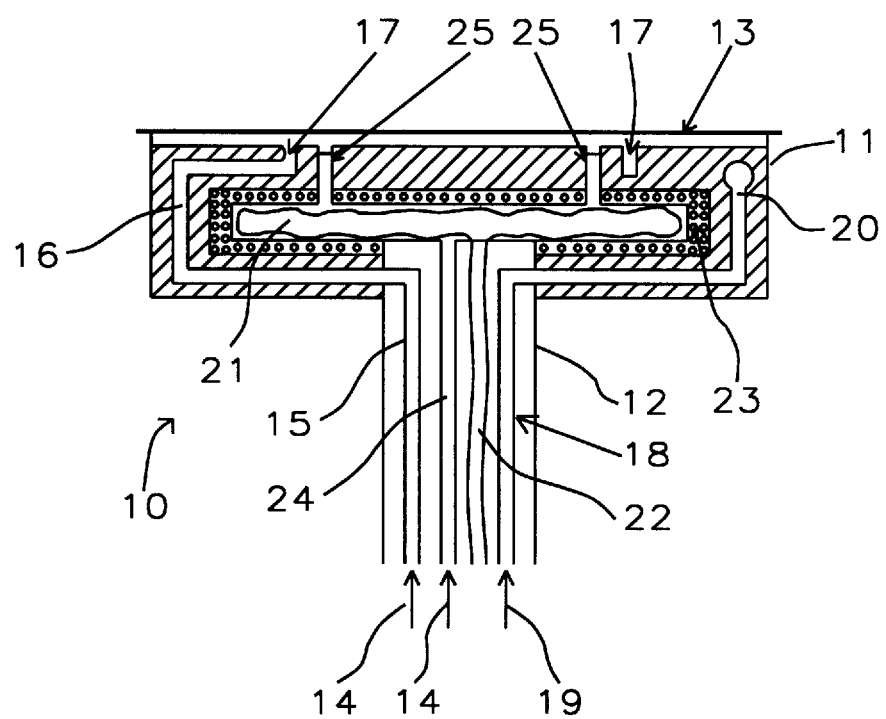
FIG. 1 is a cross-sectional view of the pedestal assembly embodying the present invention.

The ability to rapidly change the temperature of a semiconductor wafer, placed in a chamber for physical vapor deposition/chemical vapor deposition (PVD/CVD), is of great economic importance in a wafer production environment since it allows setups requiring different temperature settings to be run on the same pedestal and in the same chamber. This lowers cost since a larger chamber would be required otherwise. The fast ramping up or down of the semiconductor wafer temperature similarly reduces manufacturing cost since the increased throughput, without affecting the quality of the finished product, increases output or lowers capital cost. Precise temperature control over a wide range yields increased flexibility of process control.

Referring now to FIG. 1, a dual temperature heater apparatus 10 embodying the present invention is shown, suitable for use in a PVD/CVD system to rapidly change the temperature of a semiconductor wafer. A fast change in temperature is achieved by incorporating three systems in the pedestal: cool gas to cool the semiconductor wafer, cooling water to keep the pedestal cooled and heated gas to bring the semiconductor wafer to the required high temperature.

A pedestal 11, supported by a central and hollow supply shaft 12, has a semiconductor wafer 13 resting on its top surface. Backside process gas 14 enters pipe 15 which is connected to a set of passageways 16. These passageways, embedded in the pedestal, exit on the top of the pedestal in a plurality of cold gas outlets 17. A second pipe 18, also located in the central supply shaft and admitting cooling water 19, connects to a second set of passageways 20 in the pedestal. Passageways 20 circle beneath the top surface of the pedestal and connect to a cooling water return line (not shown).

A heater cavity 21 is located centrally in the pedestal and approximately equidistant between top and bottom of the pedestal. An electrical heating element 22 is embedded in the heater cavity and is attached to an electrical power source (not shown). A vacuum jacket 23 surrounds this heater cavity on all sides, the air being evacuated by suitable means (not shown). A third pipe 24, located in the central supply shaft, is attached to the heater cavity and admits backside process gas. A number of hot gas outlets 25 connect between the heater cavity and the pedestal top surface. The backside process gas in pipe 24 flows through the heater cavity, gets heated by the heating element and heats up the semiconductor wafer after escaping from the hot gas outlets.

When the process cycle calls for heating of the semiconductor wafer, both the backside process gas through pipe 15, and the cooling water through pipe 18 are turned off. The backside process gas through pipe 24 is allowed to flow. The heating element is normally kept heated for a fast transition from cold to hot. However, power to the heating element can be turned on or off. A thermal couple (not shown), embedded in the heater cavity, controls the semiconductor wafer temperature during processing by causing the electrical power to the heating element to be modulated. The power rating of the heating element ranges from 2000 to 3000 Watts. This set-up is intended to heat the semiconductor wafer to about 480° C. Because of the thermal mass of the heater cavity and because the vacuum jacket insulates the heater cavity from the pedestal, the semiconductor wafer can quickly change temperature from about 25° to 480° C. in a time ranging from about 0.5 to 2 minutes.

Cooling of the semiconductor wafer is achieved by the method of forcing cool backside process gas across the wafer, lowering the temperature of the pedestal by running cooling water through it, and turning off the backside process gas in pipe 24. In detail, this is done by turning on the flow of backside process gas through pipe 15, embedded passageways and out through the cool gas outlets. Since the pedestal is also cooled by turning on the flow of cooling water, the overall cooling is made more effective. This is further aided by turning off the flow of backside process gas through the heater cavity. Additionally, power to the heating element can be shut off. The semiconductor wafer is cooled to a temperature in the range from 25° to 50° C. Cooling of the semiconductor wafer from about 480° to 50° C. ranges from about 1 to 2 minutes. The speed of the cool-down cycle can be varied by changing the flow of cooling water in the range from 5 to 10 liters per minute.

Fast heating and cooling of the semiconductor wafer is also achieved by the method of employing a vacuum jacket to insulate the pedestal from the heater cavity and thus reducing thermal conduction. Precise temperature control over a wide range is possible by controlling the on/off times of the cold gas and hot gas outlets and of the cooling water flow. Another controlling parameter is the cooling water flow rate.

While the invention has been particularly shown and described with reference to the preferred embodiments thereof, it will be understood by those skilled in the art that various changes in form and details may be made without departing from the spirit and scope of the invention.

What is claimed is:

1. An apparatus for rapidly changing the temperature of a semiconductor wafer, comprising:
   a pedestal having a top surface and an underside, said pedestal being supported by a central and hollow supply shaft, and said semiconductor wafer resting on said top surface of said pedestal;
   a first pipe, located in said central supply shaft, entering said pedestal on said underside and connected to a first set of passageways, said first set of passageways, embedded in said pedestal, exiting on said top surface in a plurality of cold gas outlets, and said first pipe admitting backside process gas;
   a second pipe, located in said central supply shaft, entering said pedestal on said underside and connected to a second set of passageways, said second set of passageways, embedded in said pedestal, having a common return line, and said second pipe admitting cooling water;
   a heater cavity located centrally in said pedestal with an electrical heating element placed within said heater cavity, and with means for attaching said electrical heating element to an electrical power source;
   a thermal couple within said heater cavity;
   a vacuum jacket surrounding said heater cavity on all sides, with means for evacuating the air from said vacuum jacket;
   a third pipe, located in said central supply shaft, attached to said heater cavity and admitting said backside process gas; and
   a plurality of hot gas outlets connected between said heater cavity and said pedestal top surface.

2. The apparatus of claim 1, wherein said backside process gas in said first pipe flows through said first set of passageways and exits said plurality of cold gas outlets.

3. The apparatus of claim 1, wherein said cooling water in said second pipe flows through said second set of passageways and leaves through said common return line.

4. The apparatus of claim 3, wherein said cooling water, circling beneath said top surface of said pedestal, cools said pedestal.

5. The apparatus of claim 1, wherein said backside process gas in said third pipe flows through said heater cavity and exits said plurality of hot gas outlets.

6. The apparatus of claim 1, wherein said electrical heating element heats said backside process gas delivered by said third pipe.

7. The apparatus of claim 6, wherein said heated backside process gas heats said semiconductor wafer to temperatures in the range from 25° to 480° C.

8. The apparatus of claim 2, wherein said backside process gas cools said semiconductor wafer to temperatures in the range from 25° to 50° C.

9. The apparatus of claim 1, wherein said semiconductor wafer can change temperatures from about 25° to 480° C. in a time ranging from about 0.5 to 2 minutes.

10. The apparatus of claim 1, wherein said semiconductor wafer can change temperatures from about 480° to 50° C. in a time ranging from about 1 to 2 minutes.

11. The apparatus of claim 1, wherein said cooling water is delivered at a rate ranging from 5 to 10 liters per minute.

12. The apparatus of claim 6, wherein the power rating of said heating element ranges from 2000 to 3000 Watts.

13. A method for rapidly changing the temperature of a semiconductor wafer, comprising:
   providing a pedestal having a top surface and an underside;
   supporting said pedestal with a rigidly connected central and hollow supply shaft;
   placing said semiconductor wafer on said pedestal;
   providing a first pipe, admitting backside process gas, and located in said central supply shaft, and entering said pedestal on said underside;
   embedding a first set of passageways within said pedestal;
   connecting said first pipe to said first set of passageways;
   terminating said first set of passageways in a plurality of cold gas outlets exiting at said top surface of said pedestal;
   providing a second pipe, admitting cooling water, and located in said central supply shaft, and entering said pedestal on said underside;
   embedding a second set of passageways within said pedestal;
   connecting said second pipe to said second set of passageways;
   providing a common return line for said second set of passageways;
   providing a heater cavity located centrally in said pedestal;
   providing an electrical heating element within said heater cavity, and attaching said electrical heating element to an electrical power source;
   providing a thermal couple within said heater cavity;
   surrounding said heater cavity on all sides with a vacuum jacket, and evacuating the air from said vacuum jacket;
   connecting a third pipe, admitting backside process gas, to said heater cavity; and
   connecting to said heater cavity a plurality of hot gas outlets on said top surface of said pedestal.

14. The method of claim 13, wherein said electrical heating element heats said backside process gas delivered by said third pipe.

15. The method of claim 14, wherein power to said electrical heating element can be turned on or off.

16. The method of claim 14, wherein said heated backside process gas exits through said hot gas outlets.

17. The method of claim 13, wherein said vacuum jacket insulates said heater cavity from said pedestal thus reducing thermal conduction.

18. The method of claim 13, wherein said backside process gas, in said first pipe, cools said semiconductor wafer.

19. The method of claim 18, wherein the flow of said backside process gas for said first pipe and said third pipe can be turned on or off individually for said first pipe and said third pipe.

20. The method of claim 16, wherein said heated backside process gas heats said semiconductor wafer.

21. The method of claim 13, wherein said cooling water, in said second set of passageways, cools said pedestal.

22. The method of claim 21, wherein the flow of said cooling water can be turned on or off.

23. The method of claim 13, wherein said thermal couple, within said heater cavity, controls the temperature of said semiconductor wafer during processing.

* * * * *